(12) United States Patent
Ide et al.

(10) Patent No.: US 6,587,185 B1
(45) Date of Patent: Jul. 1, 2003

(54) DISTANCE MEASURING APPARATUS

(75) Inventors: Eiichi Ide, Itami (JP); Fumiya Yagi, Toyonaka (JP); Hiroshi Uchino, Kyoto (JP); Koichi Kamon, Takatsuki (JP); Takashi Kondo, Sakai (JP)

(73) Assignee: Minolta Co., Ltd., Osaka (JP)

( * ) Notice: Subject to any disclaimer, the term of this patent is extended or adjusted under 35 U.S.C. 154(b) by 76 days.

(21) Appl. No.: 09/604,404

(22) Filed: Jun. 27, 2000

(30) Foreign Application Priority Data

Jun. 30, 1999 (JP) .......................................... 11-184586

(51) Int. Cl.[7] .......................... G01C 3/08; H03K 5/125
(52) U.S. Cl. ........................................ 356/5.01; 327/1
(58) Field of Search ........................... 356/5.01–5.08; 327/1

(56) References Cited

U.S. PATENT DOCUMENTS 5,243,553 A * 9/1993 Flockencier
5,303,020 A * 4/1994 Croteau
5,623,335 A * 4/1997 Bamberger ................ 356/5.01
5,835,199 A * 11/1998 Phillips et al. ............ 356/5.03

FOREIGN PATENT DOCUMENTS

JP    7-57289     3/1995
JP    7-130079    5/1995

* cited by examiner

Primary Examiner—Stephen C. Buczinski
(74) Attorney, Agent, or Firm—McDermott, Will & Emery

(57) ABSTRACT

In a distance measuring apparatus 1 having a projector 10 that projects pulse light P outside and a light receiver 20 that receives the pulse light being reflected in the outside and performs photoelectric conversion, and outputting measurement data DL responsive to a time Tf from the transmission point of time to the reception point of time of the pulse light, the following are provided: determining means 311 for determining whether a received light waveform DP is correct or includes at least two incorrect waveforms based on an output signal SP of the light receiver 20; and warning data outputting means 312 for outputting warning data DE responsive to the result of the determination when the determining means 311 determines that the received light waveform DP is incorrect.

5 Claims, 4 Drawing Sheets

1 Distance Measuring Apparatus

DISTANCE MEASURING APPARATUS

This application is based on application No. 11-184586 filed in Japan, the content of which is hereby incorporated by reference.

BACKGROUND OF THE INVENTION

1. Field of the Invention

The present invention relates to a distance measuring apparatus for measuring as distance information the round-trip propagation time of light to an object that reflects light.

2. Description of the Related Art

By measuring the so-called time of flight (TOF) from transmission of light pulse to reception of the pulse returning after reflected at an object, the distance to the object can be obtained through application of the known light propagation velocity. This method is applied in various fields such as civil engineering and astronomy. In principle, the closer to zero the pulse width is, the higher the measurement accuracy is. In actuality, however, the pulse width is larger than a value depending on constraints such as the response of the light source and the reception sensitivity. In general distance measuring apparatuses, the pulse width is approximately 50 to 100 ns where resolution of approximately several centimeters is obtained, and the waveform is unimodal. By determining the reception point of time by detecting the peak of the received light waveform, measurement can be performed with a high degree of accuracy irrespective of the amplitude of the received light waveform.

Conventionally, there has been a high possibility that a measurement value being low in reliability because the amplitude or the waveform of the received light pulse is incorrect due to low reflectance of the object or incidence of extraneous light is used as a correct measurement value. Moreover, there are occasions when the user ends measurement without noticing that since the object is too far or too dose, measurement is impossible and no measurement value is obtained.

SUMMARY OF THE INVENTION

An object of the present invention is to enable the user to check whether the measurement result is collect or not.

Another object of the present invention is to improve practicality by increasing the permissible range of a measurement condition.

According to the present invention, a distance measuring apparatus outputting measurement data responsive to a time from a transmission point of time to a reception point of time of pulse light, comprises: a projector that projects pulse light outside; a light receiver that receives the pulse light reflected in the outside; determining means for determining whether a received light waveform of the received light is correct waveform or incorrect waveforms including at least two incorrect waveforms, based on an output signal of the light receiver; and warning data outputting means for outputting warning data responsive to a result of the determination when the determining means determines that the received light waveform is incorrect.

Moreover, the distance measuring apparatus performs measurement again when the determining means determines that the received light waveform is incorrect.

Moreover, the distance measuring apparatus further comprises a controller that changes an operation setting of at least one of the projector and the light receiver based on a latest result of the determination by the determining means before measurement is performed again.

Moreover, the warning data outputting means outputs the warning data when it is determined that the received light waveform is incorrect in a last time re-measurement of a set number of re-measurements.

Moreover, according to the present invention, a distance measuring apparatus outputting measurement data responsive to a time from a transmission point of time to a reception point of time of pulse light, comprises: a projector that projects pulse light outside; a light receiver that receives the pulse light reflected in the outside; a storage medium for storing an output waveform of the light receiver therein; determining means for determining whether the output waveform stored in the storage medium is correct or incorrect; and warning data outputting means for outputting warning data responsive to a result of the determination when the determining means determines that the output waveform is incorrect.

BRIEF DESCRIPTION OF THE DRAWINGS

These and other objects and features of this invention will become dear from the following description, taken in conjunction with the preferred embodiments with reference to the accompanied drawings in which.

DETAILED DESCRIPTION OF THE PREFERRED EMBODIMENTS

Figure 1:
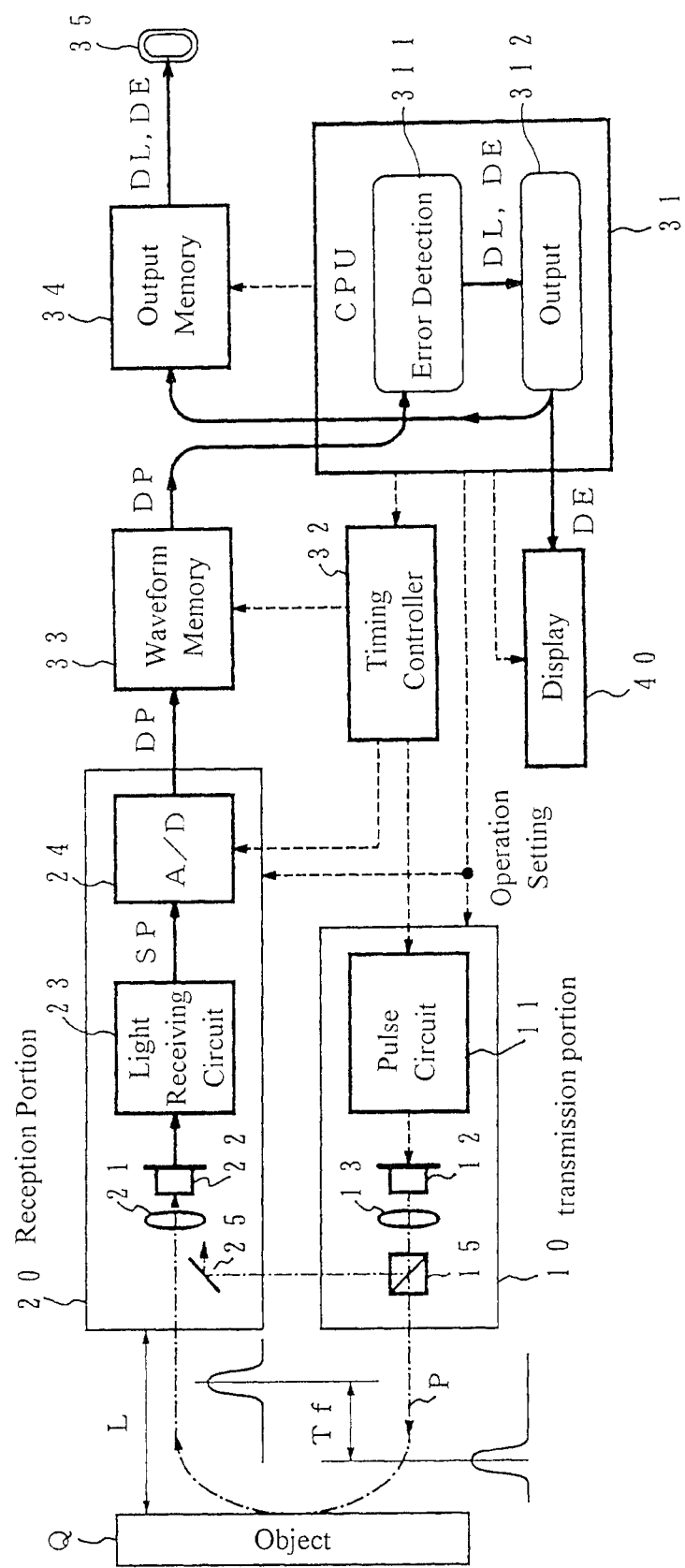
FIG. 1 shows the structure of a distance measuring apparatus according to an embodiment of the present invention.

FIG. 1 shows the structure of a distance measuring apparatus according to an embodiment of the present invention. The solid arrows in the figure show the flow of data, and the broken arrows show the flow of control signals.

The distance measuring apparatus 1 comprises a transmission portion 10 as light projecting means, a reception portion 20 as light receiving means, a central processing unit (CPU) 31, a timing controller 32, a waveform memory 33, an output memory 34, and a display 40. The operation of the distance measuring apparatus 1 is controlled by the CPU 31.

The transmission portion 10 comprises a pulse circuit 11 that defines the light emission time, a light emitting device (semiconductor laser) 12, a light projecting lens 13 and a light quantity distributor 15, and emits outside and to the reception portion 20 pulse light P of a width of approximately 100 ns in response to an instruction from the timing controller 32. It is necessary for the quantity of the light emitted to the reception portion 20 only to be extremely small. The light quantity distributor 15 distributes the pulse light P to the outside and the reception portion 20, for example, at a light quantity ratio of approximately 100:1 to 1000:1. The pulse light P projected outside is reflected at an object Q to return to the distance measuring apparatus 1. The reception portion 20 comprises a light receiving lens 21, a light receiving device (for example, photodiode) 22, a light receiving circuit 23 that performs photoelectric conversion, an analog-to-digital (A/D) converter 24, and a mirror 25 that directs the pulse light from the transmission portion 10 to the light receiving lens 21. The reception portion 20 samples a reception signal (photoelectric conversion signal) SP responsive to the light reception quantity in a predetermined cycle, and outputs waveform data DP obtained by quantizing the sampling value. The waveform data DP is sequentially stored in the waveform memory 33 in the order of sampling.

The CPU 31 includes a data processing program that realizes the functions of blocks 311 and 312. The block 311 detects the transmission point of time and the reception point of time based on the waveform data DP to obtain a light propagation time Tf, and multiplies the known light propagation velocity ($3 \times 10^8$ m/s) and the light propagation time Tf to thereby generate distance data DL of, for example, 11 bits. Moreover, the block 311 performs an error detection, and transmits to the block 312 determination data comprising a 1-bit identification code representative of the presence or absence of an error and an error code DE representative of the contents of the error classified as described later. The block 312 writes into the output memory 34 measurement data of, for example, 12 bits comprising the distance data DL or the error code DE to which the identification code is added, and outputs the error code DE to the display 40. In the output memory 34, the measurement data is temporarily recorded for each measurement point. The measurement data is transmitted from the output memory 34 via a connector 35 to another apparatus (a display or a computer, etc.). The measurement data in the case where there is no error includes the distance data DL. The measurement data in the case where there is an error includes the error code DE.

In measuring the light propagation time Tf, it is important which point of time between the front edge to the rear edge of the transmission and the reception pulses is used as the reference for clocking. In the distance measuring apparatus 1, the light propagation time Tf is the period from the peak point of time when the quantity of the pulse light P directly incident from the transmission portion 10 is the maximum at the reception portion 20 to the peak point of time when the quantity of the pulse light P incident after reflected at the object Q is the maximum. That is, the first peak point of time of the received light waveform recorded over a predetermined time from a point of time slightly before the light emission is regarded as the transmission point of time, and the second peak point of time is regarded as the reception point of time. By performing a barycentric calculation in the peak detection, the resolution of the measurement is higher than in the case where the maximum sampling value is regarded as the peak. By using the peak as the reference for clocking as described above, measurement can be performed with a high degree of accuracy irrespective of the reflectance of the object Q. This is because the position, on the time base, of the peak which is the point of inflection of the pulse waveform does not vary although the light reception quantity is an inconstant quantity that depends on the reflectance. The transmission point of time can be set with the output point of time of the light emission control signal as the reference. However, by detecting the peak while monitoring the actual light emission quantity like in this example, the influence of a change in the characteristic of the light emitting device or a delay of the control signal can be eliminated.

Figure 2:
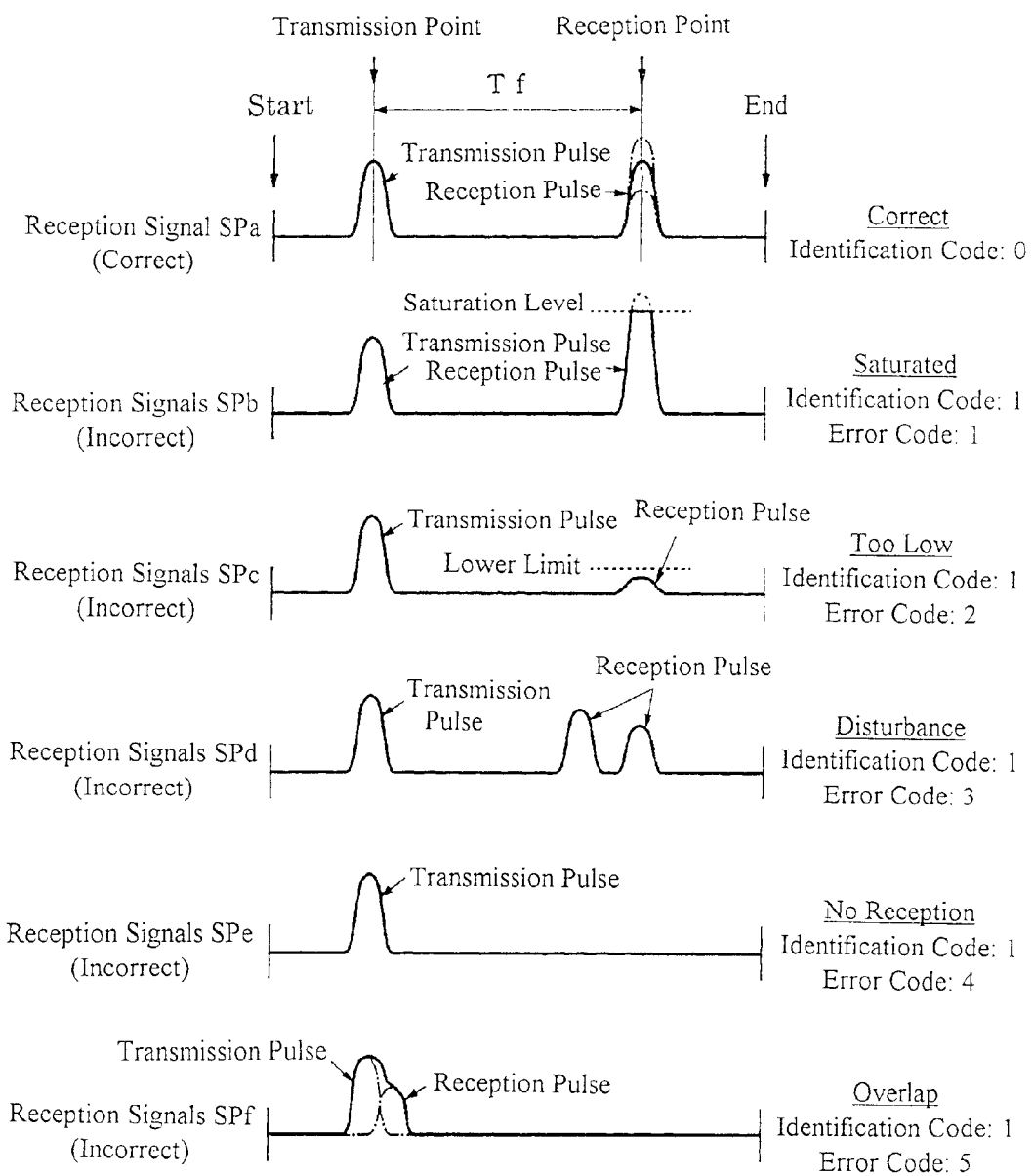
FIG. 2 shows classification of received light waveforms and correspondence with error codes.

FIG. 2 shows classification of received light waveforms and correspondence with error codes.

In a reception signal SPa where a transmission pulse and a reception pulse of a predetermined amplitude appear, the waveform is correct. In this case, the value of the identification code is "0". On the contrary, in reception signals SPb to SPf, the waveform is incorrect. In these cases, the value of the identification code is "1".

In the reception signal SPb, since the reception is saturated, the peak cannot be correctly obtained. That is, the reliability of the measurement value is low. In this case, the value of the error code is "1". Causes of the saturation include that the light emission intensity is excessive for the reflectance at the measurement point and that a processing condition (for example, signal amplification factor) at the light receiving circuit is inappropriate. There is a possibility that the waveform becomes correct by changing an operating condition of the light emitting device or the light receiving circuit.

In the reception signal SPc, since the reception level is too low, the reliability of the measurement value is low from the viewpoint of the signal-to-noise (S/N) ratio. In this case, the value of the error code is "2". There is a possibility that the waveform becomes correct by changing an operating condition.

In the reception signal SPd, a plurality of pulses appear in addition of the transmission pulse, so that the reception point of time cannot be determined. Measurement is impossible. In this case, the value of the error code is "3". Causes include accidental incidence of extraneous light. There is a possibility that the waveform becomes correct by slightly shifting the measurement direction or performing measurement again when the extraneous light disappears.

In the reception signal SPe, no reception pulse appears, so that the reception point of time cannot be determined. Measurement is impossible. In this case, the value of the error code is "4". Causes include that the object is at a distant location outside the measurement possible range, that the light emission intensity is too low, and that light is not diffuse-reflected at the measurement point. There is a possibility that the waveform becomes correct by changing the measurement direction or an operating condition.

In the reception signal SPf, the transmission pulse and the reception pulse overlap each other, so that the transmission point of time and the reception point of time cannot be determined. Measurement is impossible. In this case, the value of the error code is "5". Causes include that the object Q and the distance measuring apparatus 1 are too close to each other.

Figure 3:
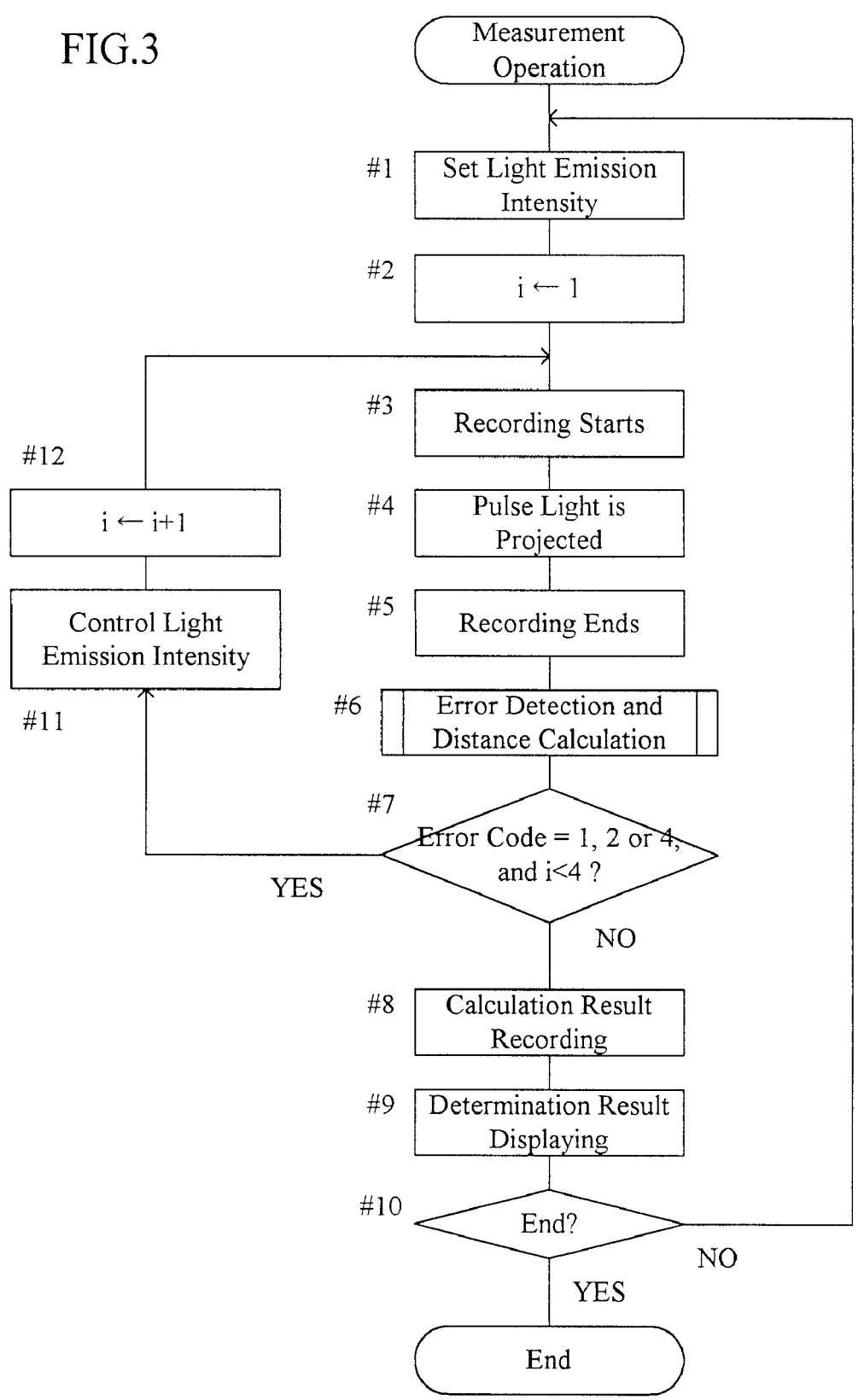
FIG. 3 is a flowchart showing an outline of the measurement operation.

FIG. 3 is a flowchart showing an outline of the measurement operation.

In the distance measuring apparatus 1 according to this embodiment, when an error occurs that is likely to be corrected by changing an operating condition, the light emission intensity is automatically changed and measurement is performed again. However, re-measurement is performed not more than three times, and the maximum number of measurements per measurement point is four. When the error is not corrected even though measurement is repeated, a message saying this and the contents of the error are output by the display 40. That is, a warning indication is given to the user.

In the measurement operation, the light emission intensity is set at the default value, and the count value of the number of measurements i is set at 1 (#1, #2). After the waveform memory 33 is placed into write state and recording of the waveform data DP is started, pulse light is projected, and the recording of the waveform data DP is ended after the expiration of a predetermined time (#3 to #5). Error detection and distance calculation are performed based on the waveform data DP obtained for the predetermined time (#6), and the value of the error code is checked (#7).

When the value of the error code is 1, 2 or 4 and the number of measurements i has not reached the maximum value four, the light emission intensity is increased or decreased in accordance with the error. Then, the number of measurements i is incremented by one, and the process returns to step #3 to perform measurement again (#7, #11, #12, #3).

When there is no error (the waveform is correct), the value of the error code is 3 or 5, or the number of measurements i is the maximum value, the calculation result recording processing (#8) to write the distance data DL into the output memory 34, and the determination result displaying processing (#9) to output a message are executed. Then, the process shifts to the next measurement operation when an end instruction operation is not performed (#10). That is, in a structure performing measurement every instruction operation, the process waits for the next operation, and in a structure having a scanning mechanism that automatically changes the projection direction, measurement for the next measurement point is started.

Figure 4:
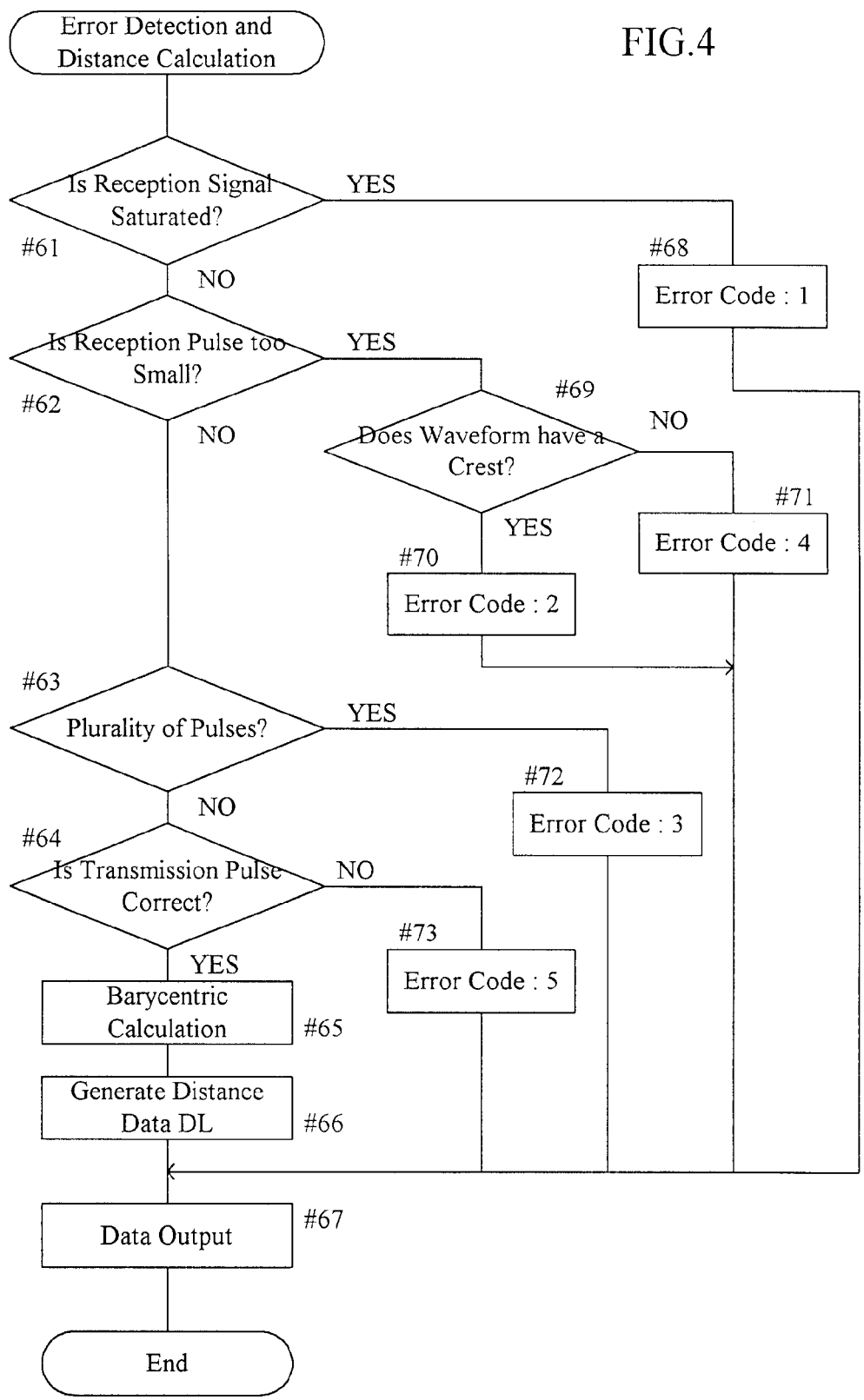
FIG. 4 is a flowchart showing an error detection and distance calculation subroutine.

FIG. 4 is a flowchart showing an error detection and distance calculation subroutine.

When the reception signal is saturated, the value of the error code is set at 1 (#61, #68), and when a waveform having a crest is recognized even though the amplitude of the reception pulse is too small, the value of the error code is set at 2 (#62, #69, #70). In these cases, distance calculation is possible although the reliability is low. When the amplitude of the reception pulse is too small (including 0) and a waveform having a crest is not recognized, the value of the error code is set at 4 (#62, #69, #71). When a plurality of pulses that can be regarded as reception pulses are present in addition to the transmission pulse, the value of the error code is set at 3 (#63, #72). When the waveform of the transmission pulse is incorrect, the value of the error code is set at 5 (#64, #73).

When the waveform is correct, that is, when there are two normal peaks corresponding to the transmission pulse and the reception pulse, a barycentric calculation is performed to calculate the transmission point of time and the reception point of time, and the light propagation time Tf is calculated to generate the distance data DL representative of the distance L (#65, #66). Then, as above, the identification code representative of the presence or absence or and the distance data DL or the error code DE are set in an output (#67). The data set here is written into the output memory 34 at the above-described processing of step 8.

Examples of messages corresponding to the error codes are shown in TABLE 1.

TABLE 1

| Error Code Value | Output Message |
| --- | --- |
| 1 | Reception signal is saturated. Automatic adjustment could not be made. |
| 2 | Reception signal level is too low. Automatic adjustment could not be made. |
| 3 | Plural reflected beams are detected. Please perform measurement again or perform measurement at a different location. |
| 4 | Measurement object point is too far. Reflected light could not be detected. |
| 5 | Measurement object point is too close. |

In the above-described embodiment, the distance distribution in a predetermined area may be measured by changing the projection direction and performing scanning. In this case, the apparatus is structured so that measurement is performed for a predetermined point (for example, the center of the plane) as preliminary measurement, error detection and warning are performed in a manner similar to the above-described embodiment based on the waveform in this measurement, and when there is no error, real measurement (area measurement by scanning) is performed.

According to the above-described structure, the user can check whether the measurement result is correct or not, so that a measurement value being lower in reliability than a normal measurement value can be prevented from being erroneously used as the normal measurement value. Since an operating condition is automatically adjusted as circumstances demand, the permissible range of the measurement condition substantially increases, so that practicality increases.

Obviously, many modifications and variation of the present invention are possible in light of the above teachings. It is therefore to be understood that within the scope of the appended claims, the invention may be practiced other than as specifically described.

What is claimed is:

1. A distance measuring apparatus outputting measurement data responsive to a time from a transmission point of time to a reception point of time of pulse light, comprising:

a projector that projects pulse light outside the distance measuring apparatus;

a light receiver that receives the pulse light reflected from an object and returned to the distance measuring apparatus;

determining means for determining whether a received light waveform of the received light is correct or incorrect based on an output signal of the light receiver, determining that the received light waveform is incorrect includes determining that at least two received light waveforms are incorrect; and warning data outputting means for outputting warning data responsive to a result of the determination when the determining means determines that the received light waveform is incorrect.

2. The distance measuring apparatus as claimed in claim 1, wherein the distance measuring apparatus performs measurement again when the determining means determines that the received light waveform is incorrect.

3. The distance measuring apparatus as claimed in claim 2, further comprises a controller that changes an operation setting of at least one of the projector and the light receiver based on a latest result of the determination by the determining means before measurement is performed again.

4. The distance measuring apparatus as claimed in claim 2, wherein the warning data outputting means outputs the warning data when it is determined that the received light waveform is incorrect in a last time re-measurement of a set number of re-measurements.

5. A distance measuring apparatus outputting measurement data responsive to a time from a transmission point of time to a reception point of time of pulse light, comprising:

a projector that projects pulse light outside the distance measuring apparatus;

a light receiver that receives the pulse light reflected from an object and returned to the distance measuring apparatus;

a storage medium for storing an output waveform of the light receiver therein;

determining means for determining whether the output waveform stored in the storage medium is correct or incorrect; and warning data outputting means for outputting warning data responsive to a result of the determination when the determining means determines that the output waveform is incorrect.

* * * * *